United States Patent
Zeidan (10) Patent No.: US 7,315,172 B2
(45) Date of Patent: Jan. 1, 2008

(54) METHOD FOR MEASURING SPECTRAL NOISE DENSITIES BEYOND INSTRUMENT CAPABILITY WITH DETERMINISTIC CONFIDENCE LEVELS

(75) Inventor: Mohamad A. Zeidan, Austin, TX (US)

(73) Assignee: National Instruments Corporation, Austin, TX (US)

( * ) Notice: Subject to any disclaimer, the term of this patent is extended or adjusted under 35 U.S.C. 154(b) by 182 days.

(21) Appl. No.: 11/198,628

(22) Filed: Aug. 5, 2005

(65) Prior Publication Data

US 2007/0032983 A1 Feb. 8, 2007

(51) Int. Cl.
- G01R 29/26 (2006.01)
- G01R 23/00 (2006.01)
- G06F 15/00 (2006.01)

(52) U.S. Cl. .................. 324/614; 324/613; 324/76.19; 702/179; 702/183; 702/189

(58) Field of Classification Search ................ 324/613, 324/614, 76.19, 76.22; 702/179, 183, 189
See application file for complete search history.

(56) References Cited

U.S. PATENT DOCUMENTS

| | | | |
|---|---|---|---|
| 4,244,024 A | | 1/1981 | Marzalek et al. |
| 4,253,152 A | | 2/1981 | Holdaway |
| 4,264,958 A | | 4/1981 | Rowell, Jr. et al. |
| 5,337,014 A | * | 8/1994 | Najle et al. .................. 324/613 |
| 6,229,316 B1 | | 5/2001 | Fukui et al. |
| 6,275,020 B1 | | 8/2001 | Nagano |
| 6,496,134 B1 | | 12/2002 | Asahina |
| 6,515,276 B2 | | 2/2003 | Baney et al. |
| 6,614,527 B2 | | 9/2003 | Fuhrmann et al. |
| 6,621,277 B2 | | 9/2003 | Mar |

(Continued)

OTHER PUBLICATIONS

A. A. Moulthrop and M. S. Muha; "Accurate Measurement of Signals Close to the Noise Floor on a Spectrum Analyzer"; IEEE Trans. on Microwave Theory and Techniques; Nov. 1991; pp. 1882-1885; vol. 39, No. 11.
"Spectrum Analyzer Measurements and Noise—Application Note 1303"; Agilent Technologies, Inc.; Feb. 11, 2003; 32 pages; U.S.A.

*Primary Examiner*—Anjan Deb
*Assistant Examiner*—Timothy J Dole
(74) *Attorney, Agent, or Firm*—Meyertons Hood Kivlin Kowert & Goetzel, P.C.; Jeffrey C. Hood; Mario J. Lewin (57) ABSTRACT

A mechanism for measuring noise densities below the noise floor of a measuring instrument. The measuring instrument may first acquire a fully-averaged reference spectral noise density trace and estimate corresponding reference statistical parameters. Based on the reference statistical parameters, the measuring instrument may construct a reference spectral noise density distribution. The measuring instrument may also acquire a fully-averaged sum spectral noise density trace and estimate corresponding sum statistical parameters. Based on the sum statistical parameters, the measuring instrument may construct a sum spectral noise density distribution. The measuring instrument may extract a spectral noise density distribution from the reference and sum distributions. The measuring instrument may also determine a confidence interval based on a desired confidence level. The measuring instrument may then determine a desired spectral noise density measurement based on an extracted mean of the spectral noise density and the computed confidence interval.

23 Claims, 4 Drawing Sheets

U.S. PATENT DOCUMENTS 6,675,106 B1 1/2004 Keenan et al.
6,700,366 B2 3/2004 Truesdale
6,775,840 B1 8/2004 Naegel et al.
2004/0100244 A1 5/2004 Kurosawa

* cited by examiner

METHOD FOR MEASURING SPECTRAL NOISE DENSITIES BEYOND INSTRUMENT CAPABILITY WITH DETERMINISTIC CONFIDENCE LEVELS

BACKGROUND OF THE INVENTION

1. Field of the Invention

This invention relates to methods for performing noise density measurements and, more particularly, to measuring spectral noise densities below the noise floor of a measuring instrument.

2. Description of the Related Art

Scientists and engineers typically use spectrum analyzers to perform spectral noise density measurements. Noise is a result of random motion of electrons, which by the central limit theorem leads to a noise signal of Gaussian distribution. The power of a noise signal is a parameter that is typically measured with spectrum analyzers in the form of noise density.

The log scale on spectrum analyzers usually distorts the original nature of a noise power distribution. In a typical case when VBW/RBW=1, the standard deviation of the noise power distribution on a log scale may be approximately 5.56 dB. Using video averaging (ensemble log averaging, as opposed to true power averaging) available in most spectrum analyzers to "fully-average" noise traces typically affects the power noise density distribution in three ways. First, it may reduce the standard deviation of the noise power distribution. For example, if the standard deviation is approximately 5.56 dB and N is the number of points in the noise trace, the standard deviation may be reduced to $5.56/\sqrt{N}$. Second, it may bias the mean by approximately −2.51 dB. Lastly, it may result in the distribution looking Gaussian even on a log scale.

A "fully-averaged" noise trace may be a trace that does not contain significant "dips/fades". The low-power points (i.e., "dips/fades"), which on a log scale typically appear as −20 dB or −30 dB points relative to the mean, may bias the statistics. As the trace is averaged, the frequency at which the "fades" occur may decrease until they eventually disappear, which is the point when the trace may be considered to be "fully-averaged". For such a trace, the statistics may be biased; therefore, in one example, the statistics may be corrected by adding 2.51 dB to the mean and dividing the standard deviation by 1.28.

To interpret the returned spectrum analyzer trace (or the mean of the trace points) as a noise density value in dBm/Hz, the measured level at the output of the spectrum analyzer is typically manipulated in the following three ways to represent the input spectral noise density. First, since log processing may cause an under-response to noise of approximately 2.51 dB, 2.51 dB may be added. Second, normalize to a 1 Hz bandwidth by subtracting 10 times the log of the RBW, where the RBW is given in units of Hz. Lastly, compensate for the over-response due to a mismatch between 3 dB bandwidth and noise bandwidth of the spectrum analyzer. For example, in most analog spectrum analyzers having a 4-pole sync filter type, the over-response may be compensated by subtracting 0.52 dB.

Spectrum analyzers, however, have a certain capability beyond which spectral noise density measurement becomes almost impossible. For example, measuring spectral noise densities below the noise floor of the instrument is typically impossible for most spectrum analyzers.

SUMMARY OF THE INVENTION

Various embodiments of a mechanism for measuring spectral noise densities below the noise floor of a measuring instrument are disclosed. In one embodiment, the measuring instrument may first acquire a fully-averaged reference spectral noise density trace. From the fully-averaged reference spectral noise density trace, the measuring instrument may estimate reference statistical parameters, e.g., the mean, standard deviation, and the standard deviation of the mean. Based on the reference statistical parameters, the measuring instrument may construct a reference spectral noise density distribution. The measuring instrument may also acquire a fully-averaged sum spectral noise density trace. From the fully-averaged sum spectral noise density trace, the measuring instrument may estimate sum statistical parameters. Then, the measuring instrument may construct a sum spectral noise density distribution based on the sum statistical parameters.

In one embodiment, the measuring instrument may extract a spectral noise density distribution from the reference spectral noise density distribution and the sum spectral noise density distribution. After extracting the spectral noise density distribution, the measuring instrument may determine a confidence interval based on a desired confidence level. For a two-sided confidence interval, the measuring instrument may integrate both tails of the extracted spectral noise density distribution based on the desired confidence level to compute the confidence interval. For a one-sided confidence interval, the measuring instrument may integrate the upper or "high-noise" tail of the extracted spectral noise density distribution based on the desired confidence level to compute the confidence interval. The measuring instrument may then determine a desired spectral noise density measurement based on the extracted mean of the spectral noise density and the computed confidence interval.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Figure 1:
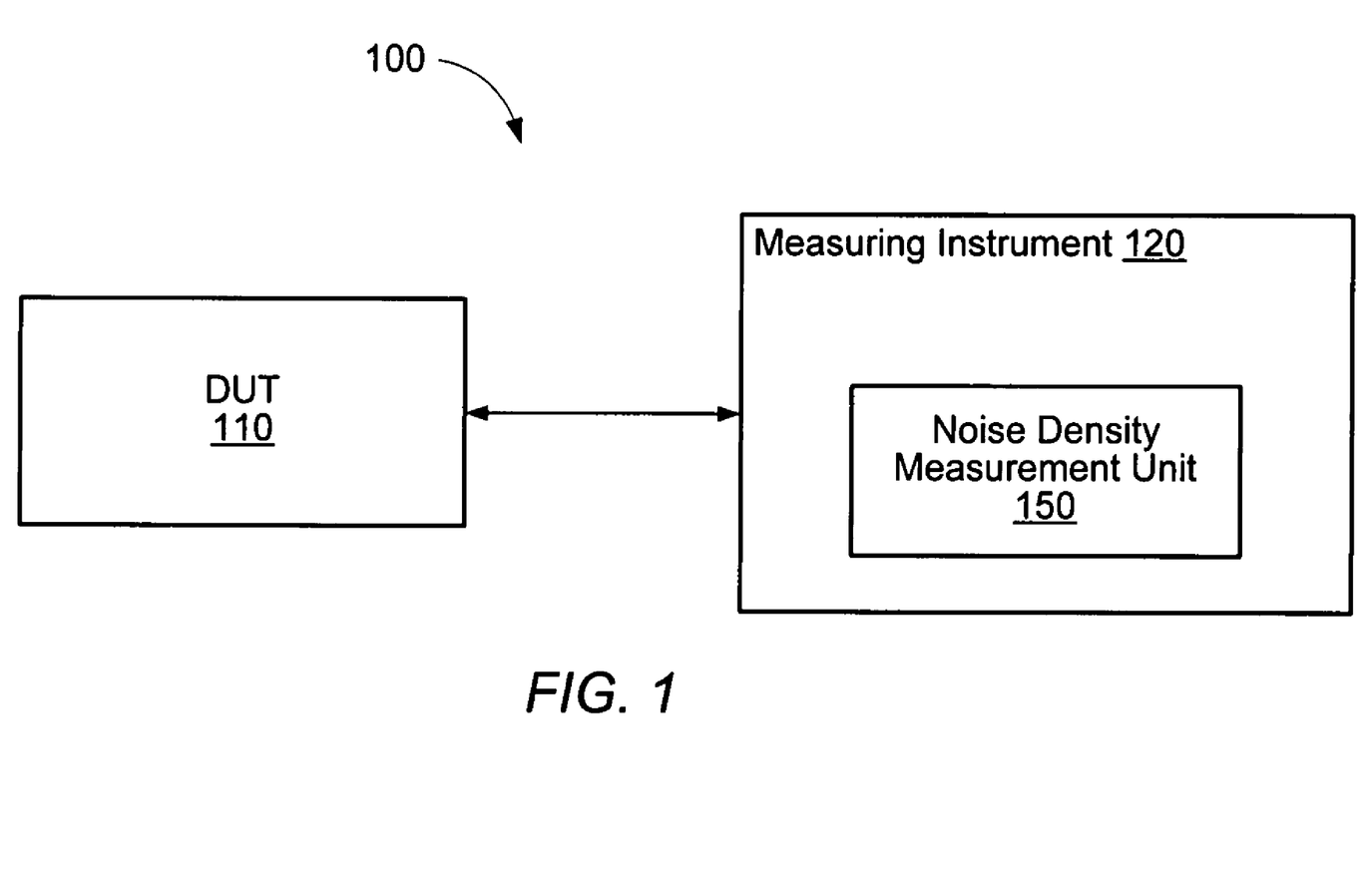
FIG. 1 is a diagram of one embodiment of a system for measuring spectral noise densities below a noise floor of a measuring instrument.

FIG. 1 is a diagram of one embodiment of a system for measuring spectral noise densities below a noise floor of a measuring instrument. In the illustrated embodiment, the system 100 includes a device under test (DUT) 110 and a measuring instrument 120. The measuring instrument 120 may be a spectrum analyzer. It is noted however that in other embodiments the measuring instrument 120 may be other types of instruments for measuring spectral noise densities. The measuring instrument 120 may include a noise density measurement unit 150 for measuring spectral noise densities below the noise floor of the instrument 120, as will be described further below with reference to FIGS. 2-4. It is noted that the noise density measurement unit 150 may be implemented in software and/or hardware.

Figure 2:
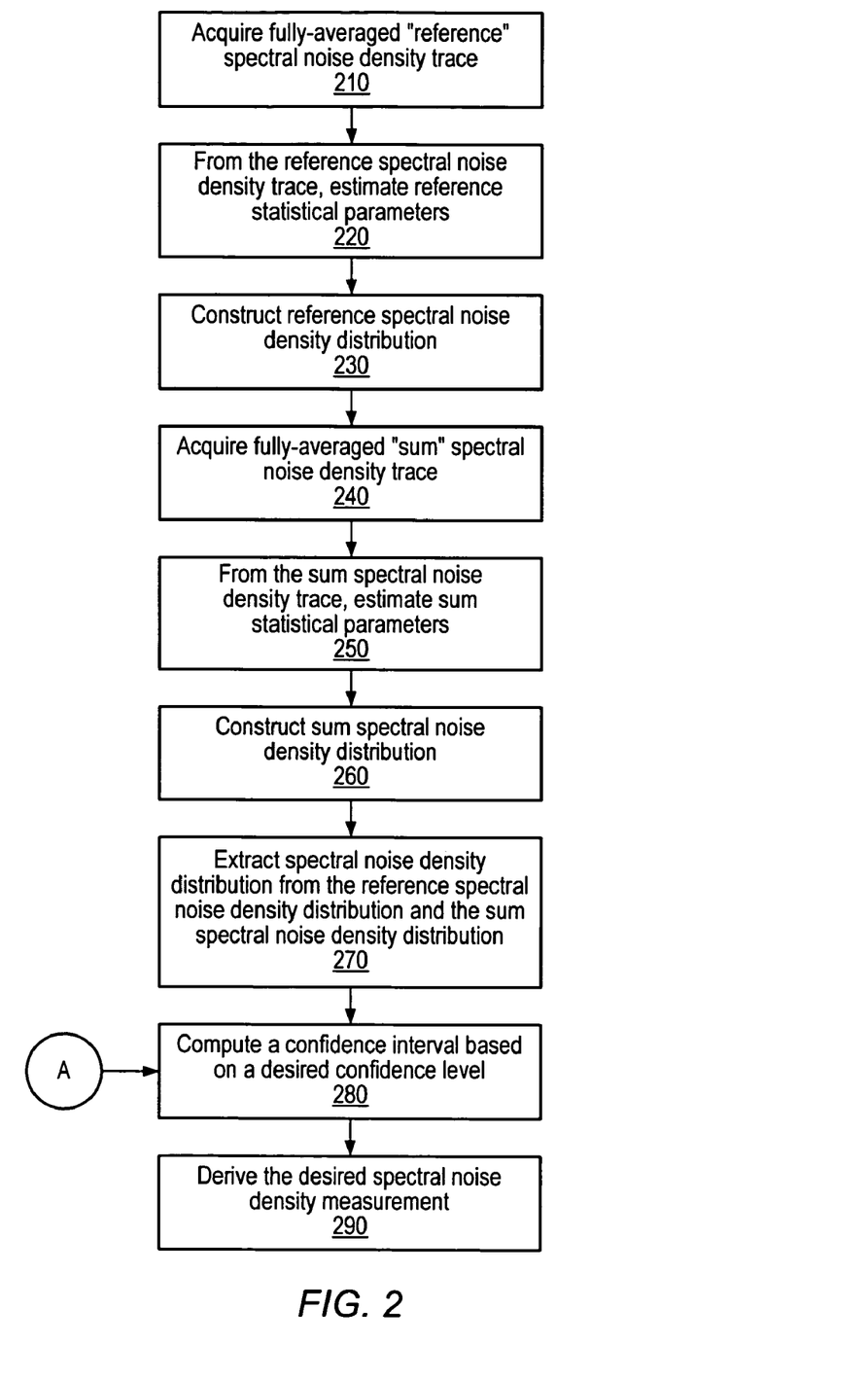
FIG. 2 is a flow diagram illustrating a method for measuring spectral noise densities below the noise floor of the measuring instrument, according to one embodiment.

FIG. 2 is a flow diagram illustrating a method for measuring spectral noise densities below the noise floor of the measuring instrument 120, according to one embodiment. It should be noted that in various embodiments, some of the steps shown may be performed concurrently, in a different order than shown, or omitted. Additional steps may also be performed as desired. In one embodiment, the method may replace a single desired but impractical measurement with at least two feasible measurements from which the desired information is mathematically derived, and with a specific uncertainty. The desired but impractical measurement may be a spectral noise density, which is lower than the noise floor of the measuring instrument 120. The feasible measurements may be a "reference" spectral noise density trace and a "sum" spectral noise density trace. It is noted that, in some embodiments, one or more of the steps shown may be performed by the noise density measurement unit 150 of the measuring instrument 120.

Referring collectively to FIG. 2 and FIG. 1, the measuring instrument 120 may acquire a fully-averaged "reference" spectral noise density trace, as indicated in block 210. The acquired "reference" noise density measurements that make up the reference spectral noise density trace may be observed by connecting an input of the measurement instrument 120 to the ideal characteristic impedance of the system (e.g., system 100). For example, the ideal characteristic impedance may be a 50 Ω or 75 Ω. The latter connection may be accomplished externally, through the user, or internally, through switching internal to the system.

As described above, a "fully-averaged" noise trace may be a trace that does not contain significant "dips/fades". In one embodiment, the low-power points or "dips/fades" of the trace may appear on a log scale as −20 dB or −30 dB points relative to the mean. As the trace is averaged, the frequency at which the "fades" occur may decrease until they eventually disappear, which is the point when the trace may be considered to be "fully-averaged". In various embodiments, a fully-averaged trace may be acquired by a measuring instrument (e.g., instrument 120) having a video averaging feature. As noted above, the statistics of the acquired fully-averaged trace may then be corrected to compensate for the biasing of the statistics resulting from the averaging operation.

In some embodiments, given a certain spectrum span in which the noise density is believed to be constant, the measuring instrument 120 may average trace points (e.g., M trace points) of the averaged trace, i.e., may additionally average trace points of the acquired fully-averaged trace that may have been video averaged N times. For each trace point, this operation may emulate the effect of acquiring and averaging one trace point of the video averaged trace (e.g., which may have been averaged N times) M times. Averaging the averaged trace points may be more practical than repeating the video averaging operation M times for the trace. In one embodiment, M−1 operations may be saved by averaging the averaged trace points. In this embodiment, the result may be a standard deviation reduction of $\sqrt{(N \times M)}$. In sum, given a spectral trace composed of M points, video averaging the trace N times and then averaging the resulting trace points may yield an equivalent standard deviation to video averaging a trace N×M times, while considering only one point $\{5.56/\sqrt{(N \times M)}\}$, and in only 1/M the time.

In block 220, the noise density measurement unit 150 of the measuring instrument 120 may estimate "reference" statistical parameters from the fully-averaged reference spectral noise density trace. The reference statistical parameters may be the mean, standard deviation, and the standard deviation of the mean. In one embodiment, the reference statistical parameters may be derived by further averaging the fully-averaged reference spectral noise density trace, e.g., by the technique described above. It is noted however that in other embodiments the reference statistical parameters may be derived by other methods.

From the reference statistical parameters, the noise density measurement unit 150 of the measuring instrument 120 may construct a reference spectral noise density distribution, as indicated by block 230. In one embodiment, the reference spectral noise density distribution may be derived from a Monte Carlo simulation. It is noted however that in other embodiments the reference spectral noise density distribution may be constructed by other techniques.

In block 240, the measuring instrument 120 may acquire a fully-averaged "sum" spectral noise density trace. The "sum" noise density measurements that make up the acquired trace may be measured by connecting the desired DUT (e.g., DUT 110 of FIG. 1) to one of the inputs of the measuring instrument 120. In other words, the sum spectral noise density trace may be the trace acquired when trying to measure the desired spectral noise density trace. In some embodiments, as described above in the "reference" spectral noise density trace section, given a certain spectrum span in which the noise density is believed to be constant, the measuring instrument 120 may average trace points (e.g., M trace points) of the averaged trace, i.e., may additionally average trace points of the acquired fully-averaged trace that may have been video averaged N times.

From the fully-averaged sum spectral noise density trace, the noise density measurement unit 150 of the measuring instrument 120 may estimate "sum" statistical parameters, as indicated by block 250. The sum statistical parameters may be the mean, standard deviation, and the standard deviation of the mean. In one embodiment, the sum statistical parameters may be derived by further averaging the fully-averaged sum spectral noise density trace, e.g., by the technique described above. It is noted however that in other embodiments the sum statistical parameters may be derived by other methods.

In block 260, the noise density measurement unit 150 of the measuring instrument 120 may construct a sum spectral noise density distribution from the sum statistical parameters. In one embodiment, the sum spectral noise density distribution may be derived from a Monte Carlo simulation.

It is noted however that in various embodiments the sum spectral noise density distribution may be constructed by other techniques.

In one embodiment, the simulation may assume "Gaussianship" of the distributions of the two measured noise density, fully-averaged traces, i.e., the reference and sum spectral noise density traces. It is noted however that in some cases the two measured noise density traces may not have Gaussian distributions, for example, the anomalies of some spectrum analyzers may affect the distribution of measured noise power. In some embodiments, it may be useful to check the distribution of noise power measured by a particular measuring instrument and confirm its "Gaussianship" before using it in accordance to the above-described method. One way of checking the distribution may be by investigating how well a histogram of the points of the measured fully-averaged trace can fit into a Gaussian curve. Another way to check the distribution may be to acquire a single non-averaged sweep, and compute the standard deviation of the trace points, and compare it to the theoretical 5.56 dB. The closer the standard deviation is to the theoretical 5.56 dB, the more conforming.

In block 270, the noise density measurement unit 150 of the measuring instrument 120 may extract the desired spectral noise density distribution, which is below the noise floor of the instrument 120, from the reference spectral noise density distribution and the sum spectral noise density distribution. In one embodiment, two random arrays may be generated in such a way that their distributions represent the spectral noise density distribution of the sum and the reference. Then, the desired spectral noise density distribution may be constructed by creating a histogram of an array that is built by passing each of the points of the two random arrays in a Monte Carlo fashion through the following noise density equation.

$$N_d = 10 \log_{10}\left(10^{\frac{N_s}{10}} - 10^{\frac{N_r}{10}}\right);$$

$N_d$=desired spectral noise density {dBm/Hz};
$N_r$=reference spectral noise density {dBm/Hz};
$N_s$=sum spectral noise density {dBm/Hz};
Where $N_d$, $N_r$<$N_s$.

In general, the noise density equation is the subtraction of reference noise power from the sum noise power. Each of the reference and sum distributions has a random array of points representing the distributions, and these points are passed one by one through the above equation to obtain an array whose distribution is that of the desired spectral noise density. In one example, if each of the reference and sum arrays has 100 k points, then the array representing the desired spectral noise density may also have 100 k points. In one embodiment, the mean of the distribution of the desired spectral noise density may be calculated by passing the mean of the reference distribution and the mean of the sum distribution through the noise density equation.

The resulting distribution of the desired spectral noise density may or may not look Gaussian-like. The distribution (shape) of the extracted spectral noise density may depend on the following three factors: (1) The standard deviation of the reference spectral noise density distribution, (2) The standard deviation of the sum spectral noise density distribution, and (3) The difference between the means of the reference and sum spectral noise density distributions. The interaction between these three factors may determine whether the resulting distribution of the desired spectral noise density looks symmetrical and Gaussian or skewed and tailed.

The standard deviations of both the reference and sum distributions may significantly interact with the difference between the means of the reference and sum distributions. The concept of distance between the reference and sum distributions may depend on both of them. For instance, keeping the difference between the means constant, while reducing the standard deviations of both measurements (e.g., by increasing averaging), may make the distributions look further apart. Also, keeping the difference between the means constant, while increasing the standard deviations of the distributions, may make the distributions look closer to one another. In some cases, the distributions may overlap at some point. When discussing overlapping of distributions, a certain fixed number of standard deviations is assumed; otherwise, the distributions theoretically extend to infinity on both sides with decreasing probabilities.

Figure 3A:
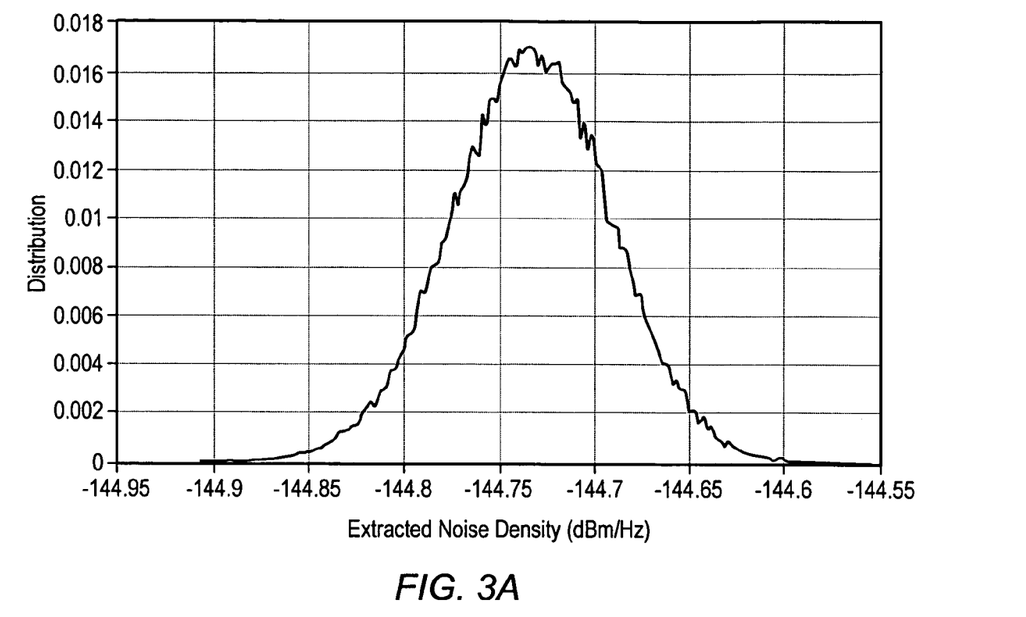
FIG. 3A and FIG. 3B are diagrams illustrating examples of Gaussian-like and non-Gaussian-like distributions of the extracted spectral noise density.
Figure 3B:
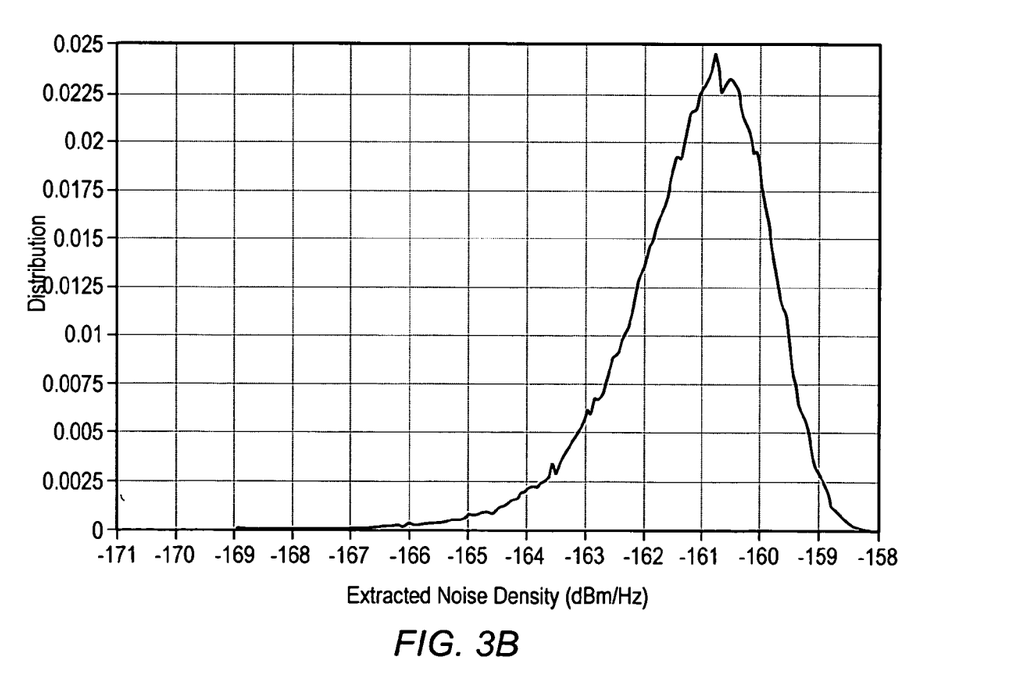

The further apart the reference and sum distributions (which may depend on both the difference of the means, and the standard deviation of both measurements) are, the more symmetric and Gaussian the distribution of the extracted spectral noise density would look like. The closer together the reference and sum distributions are, the more "tailed" and non-Gaussian-like the distribution of the extracted spectral noise density becomes. FIGS. 3A and 3B illustrate the distribution of the extracted spectral noise density in two cases, according to one embodiment. In these particular cases, the standard deviations of both the sum and reference noise density measurements are approximately 0.02 dB. FIG. 3A illustrates the symmetrical, Gaussian-like distribution of the extracted spectral noise density when the sum spectral noise density level is 3 dB above the reference spectral noise density level, according to one embodiment. In FIG. 3A, the extracted spectral noise density may be at approximately the same level as the reference spectral noise density. FIG. 3B illustrates the tailed, non-Gaussian-like distribution of the extracted spectral noise density when the sum spectral noise density level is 0.1 dB above the reference spectral noise density level, according to one embodiment. In FIG. 3B, the extracted spectral noise density may be approximately 16 dB below the reference spectral noise density level. In sum, the shape, the mean, and the standard deviation of the distribution of the extracted spectral noise density may be dependent on the statistical parameters of the reference and sum distributions.

Figure 4:
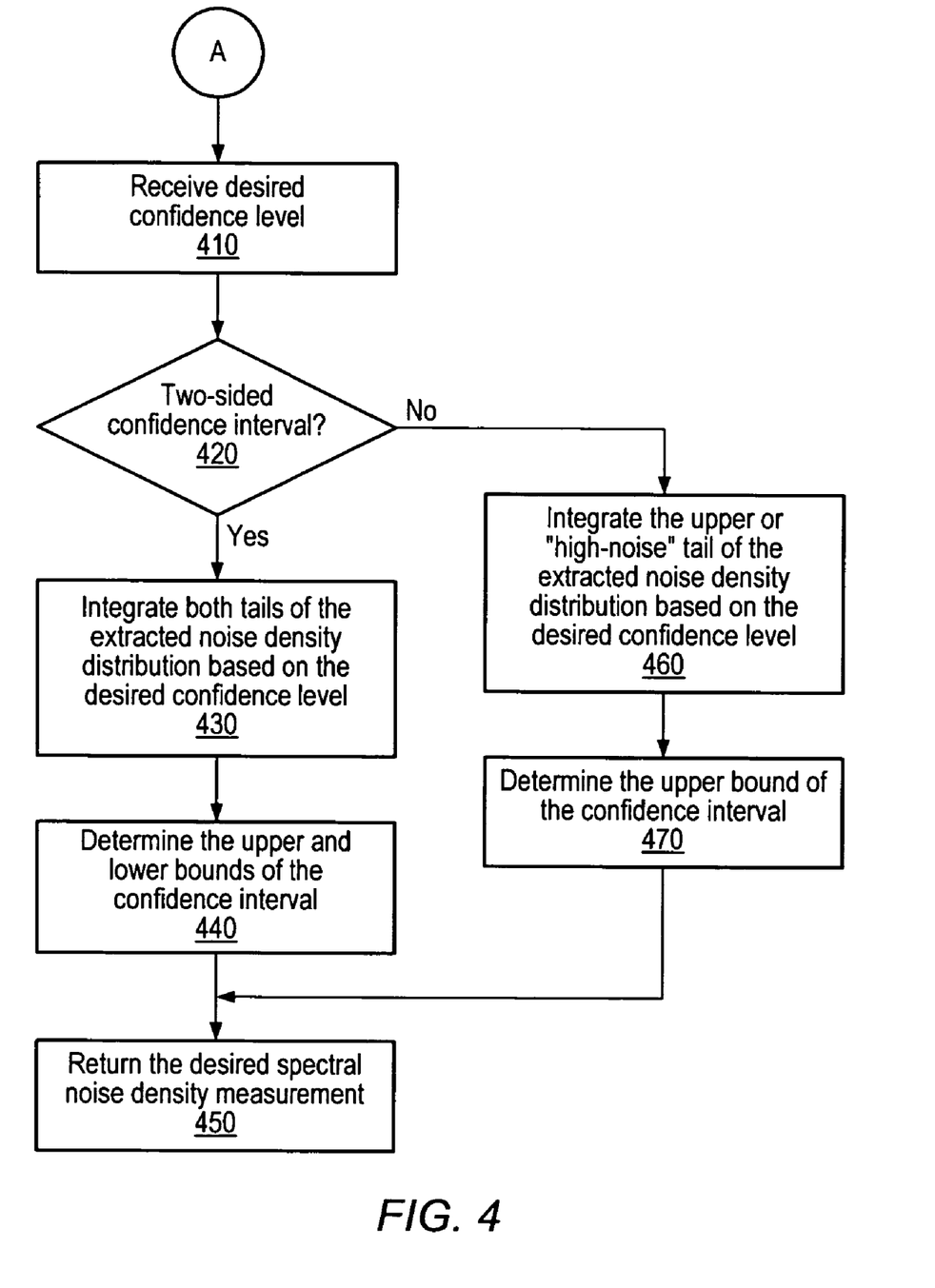
FIG. 4 is a flow diagram illustrating a method for computing a confidence interval based on a desired confidence level.

Returning to FIG. 2, in block 280, the noise density measurement unit 150 of the measuring instrument 120 may compute a confidence interval based on a desired confidence level (see FIG. 4). Then, the noise density measurement unit 150 of the measuring instrument 120 may derive the desired spectral noise density measurement (block 290), which is the spectral noise density that is below the noise floor of the measuring instrument 120, based on the computed confidence interval and the extracted mean of the spectral noise density. In one embodiment, the extracted mean of the spectral noise density may be computed by passing the mean of the reference distribution and the mean of the sum distribution through the noise density equation shown above. In some embodiments, the desired spectral noise density measurement may be derived based on the computed confidence interval and the mean of the extracted spectral noise density distribution. It is noted however that in other embodiments the desired spectral noise density measurement may be derived based on the computed confidence interval and another point in the extracted spectral noise density distribution.

FIG. 4 is a flow diagram illustrating the method for computing a confidence interval based on a desired confidence level (block 280 of FIG. 2), according to one embodiment. It should be noted that in various embodiments, some of the steps shown may be performed concurrently, in a different order than shown, or omitted. Additional steps may also be performed as desired.

Referring collectively to FIG. 4 and FIGS. 1-2, after extracting the spectral noise density distribution, the measuring instrument 120 may receive a desired confidence level to be used in finding the confidence interval associated with the extracted noise density distribution, as indicated in block 410. For example, the measuring instrument 120 may receive a desired confidence level of 95%, 99%, or 99.9%, among others. In block 420, the measuring instrument may determine whether to compute a one-side or a two-sided confidence interval.

For a two-sided confidence interval, the measurement instrument 120 (e.g., the noise density measurement unit 150 of FIG. 1) may integrate both tails of the extracted noise density distribution based on the desired confidence level to compute the confidence interval, as indicated by block 430. In one embodiment, the measurement instrument 120 may integrate each of the two tails of the extracted noise density distribution (i.e., the tails at the upper and lower end of the distribution) until each of the results equals (1−confidence level)÷2. For example, if the desired confidence level is 95% (or 0.95), the measurement instrument 120 may integrate each of the two tails of the extracted noise density distribution until each of the results equals 2.5% (or 0.025). In block 440, the measuring instrument 120 may determine the upper and lower bounds of the confidence interval based on the integration operation results. In one embodiment, the points in the extracted noise density distribution where the results equal (1−confidence level)÷2 may be the upper and lower bounds of the confidence interval. In block 450, the desired spectral noise density measurement including the computed confidence interval is returned to the user.

For a one-sided confidence interval, the measurement instrument 120 (e.g., the noise density measurement unit 150 of FIG. 1) may integrate the upper or "high-noise" tail of the extracted noise density distribution based on the desired confidence level to compute the confidence interval, as indicated by block 460. In one embodiment, the measurement instrument 120 may integrate the tail at the upper end of the extracted noise density distribution until the result equals (1−confidence level). For example, if the desired confidence level is 95% (or 0.95), the measurement instrument 120 may integrate the upper or high-noise tail of the extracted noise density distribution until the result equals 5% (or 0.05). In block 470, the measuring instrument 120 may determine the upper bound of the confidence interval based on the integration operation result. In one embodiment, the point in the extracted noise density distribution where the result equals (1−confidence level) may be the upper bound of the confidence interval. In block 450, the desired spectral noise density measurement including the computed confidence interval is returned to the user. It is noted that in other embodiments the confidence interval may be determined by other methods.

The confidence interval width, like the extracted noise distribution shape, may be significantly dependent on the standard deviations of the reference and sum noise distributions (thus the averaging) and the difference between the means of the reference and the sum noise distributions. In general, the more the reference and sum noise distributions get closer to one another, the wider the extracted noise distribution is, and the more uncertainty there is in the extracted noise measurement. The further apart the reference and sum noise distributions (which may be achieved by increasing the averaging), the more Gaussian-like the extracted noise distribution is, and the less uncertainty there is in the extracted noise measurement.

In one embodiment, the methods described above with reference to FIGS. 2 and 4 may be performed in real-time. It is noted that, in some embodiments, the mechanisms described above with reference to FIGS. 1-4 may be used for measuring spectral noise densities at or above the noise floor of the measuring instrument 120. In various embodiments, instead of performing the reference noise density measurement, pre-calibrated reference noise densities (at particular frequencies and temperatures) may be used for measuring spectral noise densities. The pre-calibrated noise densities may either be stored in memory or other media, so as to be utilized during normal use-time.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for measuring spectral noise densities below a noise floor of a measuring instrument, the method comprising:
   constructing a reference spectral noise density distribution;
   constructing a sum spectral noise density distribution;
   extracting a spectral noise density distribution from the reference spectral noise density distribution and the sum spectral noise density distribution;
   determining a confidence interval associated with the extracted spectral noise density distribution based on a desired confidence level; and
   storing the extracted spectral noise density distribution and the confidence interval.

2. The method of claim 1, wherein said constructing a reference spectral noise density distribution includes acquiring a fully-averaged reference spectral noise density trace.

3. The method of claim 2, wherein said constructing a reference spectral noise density distribution further includes estimating a plurality of reference statistical parameters from the fully-averaged reference spectral noise density trace.

4. The method of claim 3, wherein said constructing a reference spectral noise density distribution includes constructing a reference spectral noise density distribution based on the plurality of reference statistical parameters associated with the fully-averaged reference spectral noise density trace.

5. The method of claim 1, wherein said constructing a sum spectral noise density distribution includes acquiring a fully-averaged sum spectral noise density trace.

6. The method of claim 5, wherein said constructing a sum spectral noise density distribution further includes estimating a plurality of sum statistical parameters from the fully-averaged sum spectral noise density trace.

7. The method of claim 6, wherein said constructing a sum spectral noise density distribution includes constructing a sum spectral noise density distribution based on the plurality of sum statistical parameters associated with the fully-averaged sum spectral noise density trace.

8. The method of claim 1, wherein said determining a confidence interval based on a desired confidence level includes integrating both tails of the extracted spectral noise density distribution based on the desired confidence level to determine an upper bound and a lower bound corresponding to a two-sided confidence interval.

9. The method of claim 1, wherein said determining a confidence interval based on a desired confidence level includes integrating a tail of the extracted spectral noise density distribution based on the desired confidence level to determine an upper bound corresponding to a one-sided confidence interval.

10. The method of claim 1, further comprising:
computing an extracted mean of a spectral noise density; and
determining a desired spectral noise density measurement based on the extracted mean of the spectral noise density and the confidence interval.

11. The method of claim 1, further comprising measuring spectral noise densities at or above the noise floor of the measuring instrument.

12. A measurement instrument comprising:
means for constructing a reference spectral noise density distribution;
means for constructing a sum spectral noise density distribution;
means for extracting a spectral noise density distribution from the reference spectral noise density distribution and the sum spectral noise density distribution;
means for determining a confidence interval associated with the extracted spectral
noise density distribution based on a desired confidence level; and
means for storing the extracted spectral noise density distribution and the confidence interval.

13. The measurement instrument of claim 12, further comprising means for acquiring a fully-averaged reference spectral noise density trace.

14. The measurement instrument of claim 13, wherein the means for constructing a reference spectral noise density distribution further comprises estimating a plurality of reference statistical parameters from the fully-averaged reference spectral noise density trace.

15. The measurement instrument of claim 14, wherein the means for constructing a reference spectral noise density distribution further comprises constructing a reference spectral noise density distribution based on the plurality of reference statistical parameters associated with the fully-averaged reference spectral noise density trace.

16. The measurement instrument of claim 12, further comprising means for acquiring a fully-averaged sum spectral noise density trace.

17. The measurement instrument of claim 16, wherein the means for constructing a sum spectral noise density distribution further comprises estimating a plurality of sum statistical parameters from the fully-averaged sum spectral noise density trace.

18. The measurement instrument of claim 17, wherein the means for constructing a sum spectral noise density distribution further comprises constructing a sum spectral noise density distribution based on the plurality of sum statistical parameters associated with the fully-averaged sum spectral noise density trace.

19. The measurement instrument of claim 12, wherein the means for determining a confidence interval based on a desired confidence level further comprises integrating both tails of the extracted spectral noise density distribution based on the desired confidence level to determine an upper bound and a lower bound corresponding to a two-sided confidence interval.

20. The measurement instrument of claim 12, wherein the means for determining a confidence interval based on a desired confidence level further comprises integrating a tail of the extracted spectral noise density distribution based on the desired confidence level to determine an upper bound corresponding to a one-sided confidence interval.

21. The measurement instrument of claim 12, further comprising:
means for computing an extracted mean of a spectral noise density; and
means for determining a desired spectral noise density measurement based on the extracted mean of the spectral noise density and the confidence interval.

22. A method for measuring spectral noise densities below a noise floor of a measuring instrument, the method comprising:
acquiring a fully-averaged reference spectral noise density trace;
estimating a plurality of reference statistical parameters from the fully-averaged reference spectral noise density trace;
constructing a reference spectral noise density distribution based on the plurality of reference statistical parameters associated with the fully-averaged reference spectral noise density trace;
acquiring a fully-averaged sum spectral noise density trace;
estimating a plurality of sum statistical parameters from the fully-averaged sum spectral noise density trace;
constructing a sum spectral noise density distribution based on the plurality of sum statistical parameters associated with the fully-averaged sum spectral noise density trace;
extracting a spectral noise density distribution from the reference spectral noise density distribution and the sum spectral noise density distribution;
determining a confidence interval associated with the extracted spectral noise density distribution based on a desired confidence level; and
storing the extracted spectral noise density distribution and the confidence interval.

23. A computer readable medium comprising program instructions for measuring spectral noise densities below a noise floor of a measuring instrument, wherein the program instructions are computer executable to:
construct a reference spectral noise density distribution;
construct a sum spectral noise density distribution;
extract a spectral noise density distribution from the reference spectral noise density distribution and the sum spectral noise density distribution;
determine a confidence interval associated with the extracted spectral noise density distribution based on a desired confidence level; and
store the extracted spectral noise density distribution and the confidence interval.

* * * * *